(12) United States Patent
Longueville (10) Patent No.: US 6,176,722 B1
(45) Date of Patent: Jan. 23, 2001

(54) PRINTED CIRCUIT BOARD ZERO-FORCE PLUG CONNECTOR

(75) Inventor: Jacques Longueville, Oostkamp (BE)

(73) Assignee: Tyco Electronics Logistics AG, Steinach (CH)

( * ) Notice: Under 35 U.S.C. 154(b), the term of this patent shall be extended for 0 days.

(21) Appl. No.: 09/368,135

(22) Filed: Aug. 4, 1999

(30) Foreign Application Priority Data

Jan. 21, 1999 (DE) .............................................. 199 02 262

(51) Int. Cl.⁷ .................................................... H01R 13/15
(52) U.S. Cl. .................................................................. 439/260
(58) Field of Search ................................ 439/260, 259, 439/267, 261

(56) References Cited

U.S. PATENT DOCUMENTS

| | | |
|---|---|---|
| 3,130,351 | 4/1964 | Giel . |
| 5,098,309 * | 3/1992 | Deak ..................................... 439/260 |

FOREIGN PATENT DOCUMENTS

| | | | |
|---|---|---|---|
| 24 33 385 A1 | 2/1975 | (DE) .............................. | H02R/23/10 |
| 197 18 029 A1 | 12/1997 | (DE) .............................. | H01R/23/68 |
| 0 402 613 A2 | 12/1990 | (EP) .............................. | H01R/23/68 |
| 0 878 874 A2 | 11/1998 | (EP) .............................. | H01R/23/68 |

* cited by examiner

Primary Examiner—Paula Bradley
Assistant Examiner—Phuongchi Nguyen
(74) Attorney, Agent, or Firm—Herbert L. Lerner; Laurence A. Greenberg; Werner H. Stemer

(57) ABSTRACT

The printed circuit board zero-force plug connector has a mechanism whose operation causes the plug connector to move between a fitting position (open) and a connected position (closed). The fitting position allows the insertion or removal of a printed circuit board, which makes contact correctly with the printed circuit board. The mechanism of the zero-force plug connector assembly is operated by a rotary movement of an operating member, and/or the mechanism is configured such that it starts to move the printed circuit board zero-force plug connector to the connected position only after it has locked the printed circuit board in its correct position. The printed circuit board is released from the lock only after the mechanism has caused the printed circuit board zero-force plug connector to assume its fitting position.

22 Claims, 7 Drawing Sheets

FIG 8

PRINTED CIRCUIT BOARD ZERO-FORCE PLUG CONNECTOR

BACKGROUND OF THE INVENTION

1. Field of the Invention

The present invention relates to zero-force plug connector for a printed circuit board. The system includes a mechanism by means of which the printed circuit board zero-force plug connector can be changed from a fitting position, which allows the insertion or removal of a printed circuit board to a connected position, which makes contact correctly with the printed circuit boards, and vice versa.

Printed circuit board zero-force plug connectors are used to connect two printed circuit boards to one another electrically and mechanically substantially without the application of any force. They are used, inter alia, in order to allow a first printed circuit boards to be plugged easily and safely, and essentially at right angles, onto a second printed circuit boards (for example a so-called backplane motherboard) and, in the process to connect the first printed circuit boards electrically and mechanically to the second printed circuit boards, firmly and reliably.

Printed circuit board zero-force plug connectors have been known for quite some long time and have become known in a wide range of embodiments. A printed circuit board zero-force plug connector of the above-mentioned type is described, for example, in U.S. Pat. No. 3,130,351 to Giel.

The printed circuit board zero-force plug connector described in that prior art document is permanently mounted on one of the printed circuit boards which are to be connected to one another. The other of the printed circuit boards which are to be connected to one another can be inserted into the connector. It is constructed such that, by pulling on an operating member which is provided on the printed circuit board to be inserted and is designed essentially in the form of a rod, it can be changed to a fitting position which allows the insertion or removal of a printed circuit board, and can be moved into the connected position by the insertion of a printed circuit board.

The use of such and other printed circuit board zero-force plug connectors requires that they be handled carefully and exactly in accordance with the instructions. If, for example, an attempt is made to insert a printed circuit board into a printed circuit board zero-force plug connector which is in the connected position, or an attempt is made to remove such a printed circuit board from the connector when it is in this position, then this can easily lead to damage to the printed circuit board and/or to the printed circuit board zero-force plug connector. If, on the other hand, the printed circuit board zero-force plug connector is changed to the connected position when a printed circuit board has not been inserted in accordance with the instructions, then it is possible that no correct contact will be made between the printed circuit boards which are to be connected. Both of these situations are, of course, undesirable.

A further disadvantage of printed circuit board zero-force plug connectors of that type and similar devices is that they can be operated and used correctly only when the operating members provided on the printed circuit board are arranged and dimensioned exactly in accordance with the instructions (in a relative position with respect to the printed circuit board zero-force plug connector in accordance with the instructions). Discrepancies lead virtually inevitably to the operating member (for example the operating rod in the Giel patent) and the printed circuit board zero-force plug connector not engaging correctly when the printed circuit board is in the correct position, and/or to the operating element or the printed circuit board zero-force plug connector making it harder for the printed circuit board to assume the correct position, or making this impossible.

SUMMARY OF THE INVENTION

It is accordingly an object of the invention to provide a printed circuit board zero-force plug connector, which overcomes the above-mentioned disadvantages of the heretoforeknown devices and methods of this general type and which reliably avoids and reduces to a minimum the risk of serious damage to the printed circuit board and/or to the printed circuit board zero-force plug connector and/or the risk of incorrect connection of the printed circuit boards which are to be connected.

With the foregoing and other objects in view there is provided, in accordance with the invention, a printed circuit board zero-force plug connector assembly, comprising:

a printed circuit board zero-force plug connector adapted to assume a fitting position allowing selective insertion and removal of a printed circuit board and a connected position making contact with the printed circuit board;

a mechanism operatively connected to the printed circuit board zero-force plug connector for selectively moving the circuit board zero-force plug connector into the fitting position and the connected position; and an operating member rotatably disposed for operating the mechanism with a rotary movement.

The printed circuit board zero-force plug connector makes it possible for the printed circuit board zero-force plug connector to be operated and used correctly even if the operating member (for example an operating rod) which is provided on the printed circuit board is not arranged and dimensioned exactly in accordance with exact specifications (in a relative position with respect to the printed circuit board zero-force plug connector in accordance with the instructions); thus, for example, if the length of an operating rod which is provided on the printed circuit board is incorrect, this does not necessary result in the operating rod and the printed circuit board zero-force plug connector not engaging correctly when the printed circuit board is in the correct position, and/or the operating rod or the printed circuit board zero-force plug connector making it harder for the printed circuit board to assume the correct position, or making this impossible.

Alternatively, the mechanism being adapted to start to move the printed circuit board zero-force plug connector into the connected position only after having locked the printed circuit board in a correctly aligned position, and to release the locking of the printed circuit board only after having moved the printed circuit board zero-force plug connector to the fitting position.

The alternative embodiment of the printed circuit board zero-force plug connector ensures that:

the printed circuit board zero-force plug connector can be changed to the connected position only when a printed circuit board which has been inserted into the printed circuit board zero-force plug connector is inserted correctly; and a printed circuit board can be inserted into the printed circuit board zero-force plug connector, and can be removed from it, only when the connector is in the fitting position.

Printed circuit board zero-force plug connectors of the type summarized above make it possible to reduce to a minimum the risk of serious damage to the printed circuit board and/or to the printed circuit board zero-plug connector and/or the risk of incorrect connection of the printed circuit boards which are to be connected.

In accordance with an added feature of the invention, the operating member is a rod rotatably supported about a longitudinal axis thereof on the printed circuit board.

In accordance with an additional feature of the invention, the mechanism includes a screw rotatably mounted about a longitudinal axis thereof and substantially stationary in a longitudinal direction.

In accordance with another feature of the invention, the rod and the screw engage one another to lock against relative rotation when the printed circuit board is inserted correctly into the printed circuit board zero-plug connector.

In accordance with a further feature of the invention, the rod has an end facing the mechanism and the screw has an end facing the rod, the end of the rod and the end of the screw being inserted one into the other when the printed circuit board is correctly inserted into the printed circuit board zero-force plug connector.

In accordance with again an added feature of the invention, the rod and the screw engage such that a rotation of the rod causes the screw to rotate, i.e., the rod slaves the screw.

In accordance with again an additional feature of the invention, the mechanism further includes a nut adapted to be screwed onto the screw. Preferably, the nut is non-rotatably mounted and to be moved along the screw.

In accordance with again another feature of the invention, the mechanism includes locking elements for locking the printed circuit board in its correctly inserted position.

In accordance with again a further feature of the invention, the locking elements are movably disposed or elastically bendable and their position is defined by a position of the nut of the locking mechanism.

In accordance with yet again a further feature of the invention, the locking elements are disposed to be moveable only when and for as long as the printed circuit board has not yet made or is no longer making contact with the printed circuit board zero-force plug connector.

In accordance with a concomitant feature of the invention, the mechanism is operated by a special tool.

Other features which are considered as characteristic for the invention are set forth in the appended claims.

Although the invention is illustrated and described herein as embodied in a printed circuit board zero-force plug connector, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

The printed circuit board zero-force plug connector which is described in more detail in the following text is used for electrical and mechanical connection of two printed circuit boards. The printed circuit boards to be connected are a first printed circuit board and a second printed circuit board. The first printed circuit board is intended to be plugged essentially at right angles onto the second printed circuit board. Printed circuit boards of the second printed circuit board type are, for example, so-called backplane motherboards. Typical circuit boards that are to be plugged onto the motherboard are referred to as the first printed circuit board and frequently called plug-in boards, based on the way they are fitted.

It will be understood that the use of the described printed circuit board zero-force plug connector is not limited to such applications. The printed circuit board zero-force plug connector is more generally suitable, by virtue of its nature, for connecting any printed circuit boards in any relative positions.

The printed circuit board zero-force plug connector which is described in more detail in the following text is denoted by the reference numeral 6 in the figures.

Figure 1:
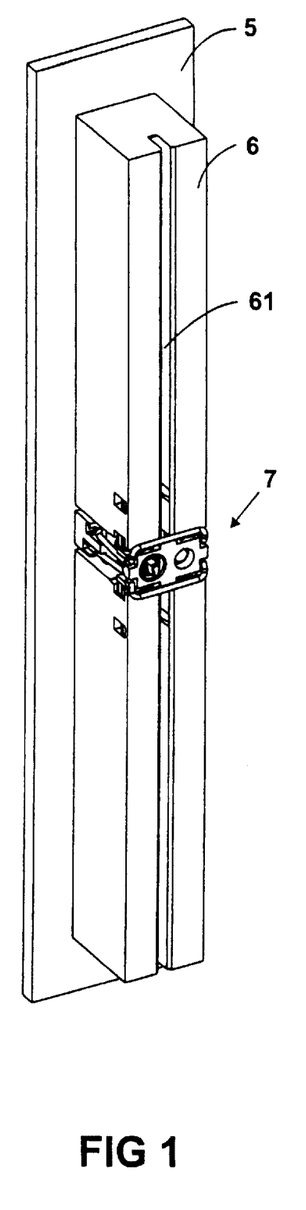
FIG. 1 is a perspective view of an exemplary embodiment of the printed circuit board zero-force plug connector in a state when it is fitted to a printed circuit board.

Referring now to the figures of the drawing in detail and first, particularly, to FIG. 1 thereof, there is seen an exemplary embodiment of a printed circuit board zero-force plug connector 6 which, in the embodiment under consideration, is permanently mounted on the second printed circuit board, which is denoted by the reference symbol 5. The printed circuit board zero-force plug connector 6 and the second printed circuit board 5 are in this case firmly connected to one another electrically and mechanically.

Figure 2:
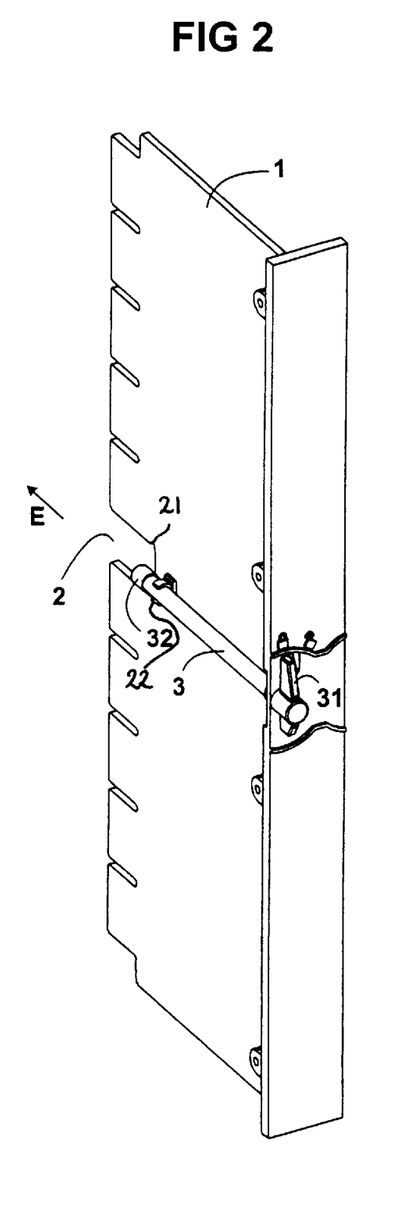
FIG. 2 is a perspective view of a printed circuit board to be inserted into the printed circuit board zero-force plug connector of FIG. 1.
Figure 3:
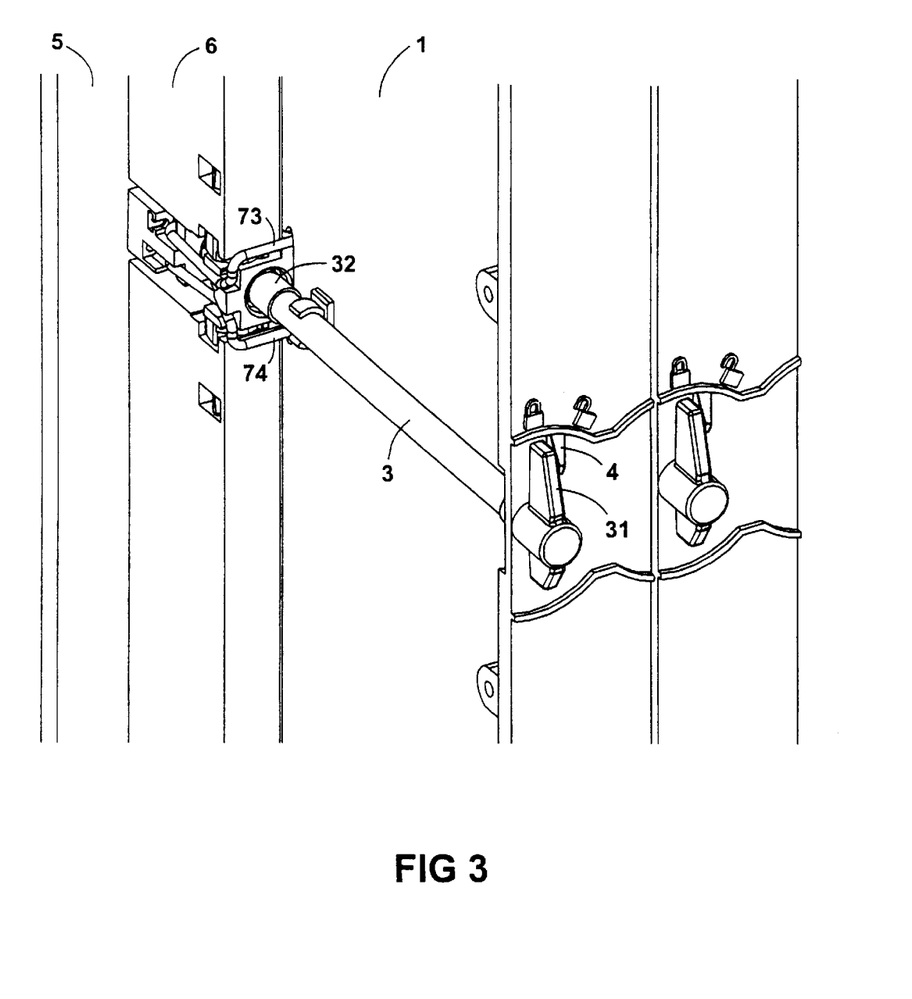
FIG. 3 is an enlarged, partial perspective view of the printed circuit board zero-force plug connector of FIG. 1 with the printed circuit board of FIG. 2 inserted into it.

The zero-force plug connector 6 has a slot 61 formed in its top face running in the longitudinal direction of the printed circuit board zero-force plug connector 6. The first printed circuit board 1 must be inserted into this slot 61 in order to be connected via the printed circuit board zero-force plug connector 6 to the second printed circuit board 5. The direction in which the first printed circuit board 1 must be moved in order to be inserted into the printed circuit board zero-force plug connector is denoted by an arrow E in FIG. 2 and, in the following text, will be referred to as the insertion direction of the first printed circuit board 1; the state in which two first printed circuit boards 1 are inserted into two printed circuit board zero-force plug connectors 6 located alongside one another is shown in FIG. 3.

In its interior, to be precise on the one side and the other side of the slot 61, the printed circuit board zero-force plug connector 6 has two connector halves (which cannot be seen in the figures) which can be pivoted or folded toward one another and away from one another by means of a (locking and pivoting) mechanism which is denoted by the reference symbol 7.

The mechanism 7 can be operated by means of an operating member which will be described in more detail in the following text.

When the connector halves are folded apart from one another, the first printed circuit board 1 can be inserted between the connector halves or can be removed essentially without any force being applied; the printed circuit board zero-force plug connector state in which its connector halves are folded apart from one another is thus referred to as its fitting position.

When the connector halves are folded together, the first printed circuit board 1 which may have been inserted between them is clamped more or less firmly between the connector halves and is thus electrically and mechanically connected to the other (second) printed circuit board via the zero-force plug connector. The plug connector state in which its connector halves are folded together is thus called its connected position.

The printed circuit board zero-force plug connector of the exemplary embodiment is thus distinguished by the following features:
  the mechanism 7 can be operated by a rotary movement of an operating member; and/or
  the mechanism 7 is designed such that it starts to move the printed circuit board zero-force plug connector to the connected position only after it has locked the first printed circuit board 1 in its correct position, and/or in that the mechanism 7 releases the locking of the first printed circuit board 1 only after it has changed the printed circuit board zero-force plug connector to the fitting position.

The particular measures by means of which this is achieved will be described with reference to exemplary embodiments. A first exemplary embodiment will be described in particular with reference to FIGS. 3 to 6, and a second exemplary embodiment will be described in particular with reference to FIGS. 7 and 8.

One common feature, among others, of the exemplary embodiments which are described in more detail in the following text is that the mechanism 7 is arranged at a central point of the printed circuit board zero-force plug connector 6 so that the printed circuit board zero-force plug connector parts which are located on the one side of the mechanism 7 and which are located on the other side of the mechanism 7 are of roughly the same size. However, it will also be understood that this is not considered a limitation. The mechanism 7 may also assume any other relative positions with respect to the printed circuit board zero-force plug connector 6.

The mechanism 7 can be integrated in the printed circuit board zero-force plug connector 6. However, it may also be a separate unit, which is attached to the printed circuit board zero-force plug connector 6 and/or to the second printed circuit board 5.

The slot 61 which is provided for the insertion of the first printed circuit board 1 in the printed circuit board zero-force plug connector 6 is interrupted at the point where the mechanism 7 is located.

The first printed circuit board 1 has a cutout 2 at the point where it strikes the mechanism 7 during insertion into the printed circuit board zero-force plug connector 6. As can be seen in particular from FIG. 2, this cutout 2 is a slot which originates from that edge of the first printed circuit board (the front edge) that faces the printed circuit board zero-force plug connector 6, extends in the opposite direction to an insertion direction E, has side cut away regions 21 and 22 (running transversely with respect to the insertion direction E) on both sides at the end facing away from the printed circuit board zero-force plug connector 6, and also has a roughly T-shaped design. The length and width of the slot 2 are dimensioned such that, when the first printed circuit board 1 is inserted correctly into the printed circuit board zero-force plug connector 6, there is no intermediate space, or in any case only a very small intermediate space, between the first printed circuit board 1 and the mechanism.

The operating member, which has already been mentioned above, for operating the mechanism 7 is, in the exemplary embodiment, a rod 3 pivotally attached to the first printed circuit board 1.

The rod 3 runs along the insertion direction E and extends from the other side of the edge facing away from the printed circuit board zero-force plug connector 6 into the recess 2 in the first printed circuit board 1. It can be rotated about its longitudinal axis and, at its (rear) end facing away from the printed circuit board zero-force plug connector 6, has an operating lever 31 (which is used to rotate it) and is designed at its (front) end facing the printed circuit board zero-force plug connector as a coupling element 32 which is suitable for engagement with the mechanism 7; instead of the (manually operable) operating lever 31, a mechanism which can be operated only by a special tool could also be provided for rotating the rod 3.

Figure 4:
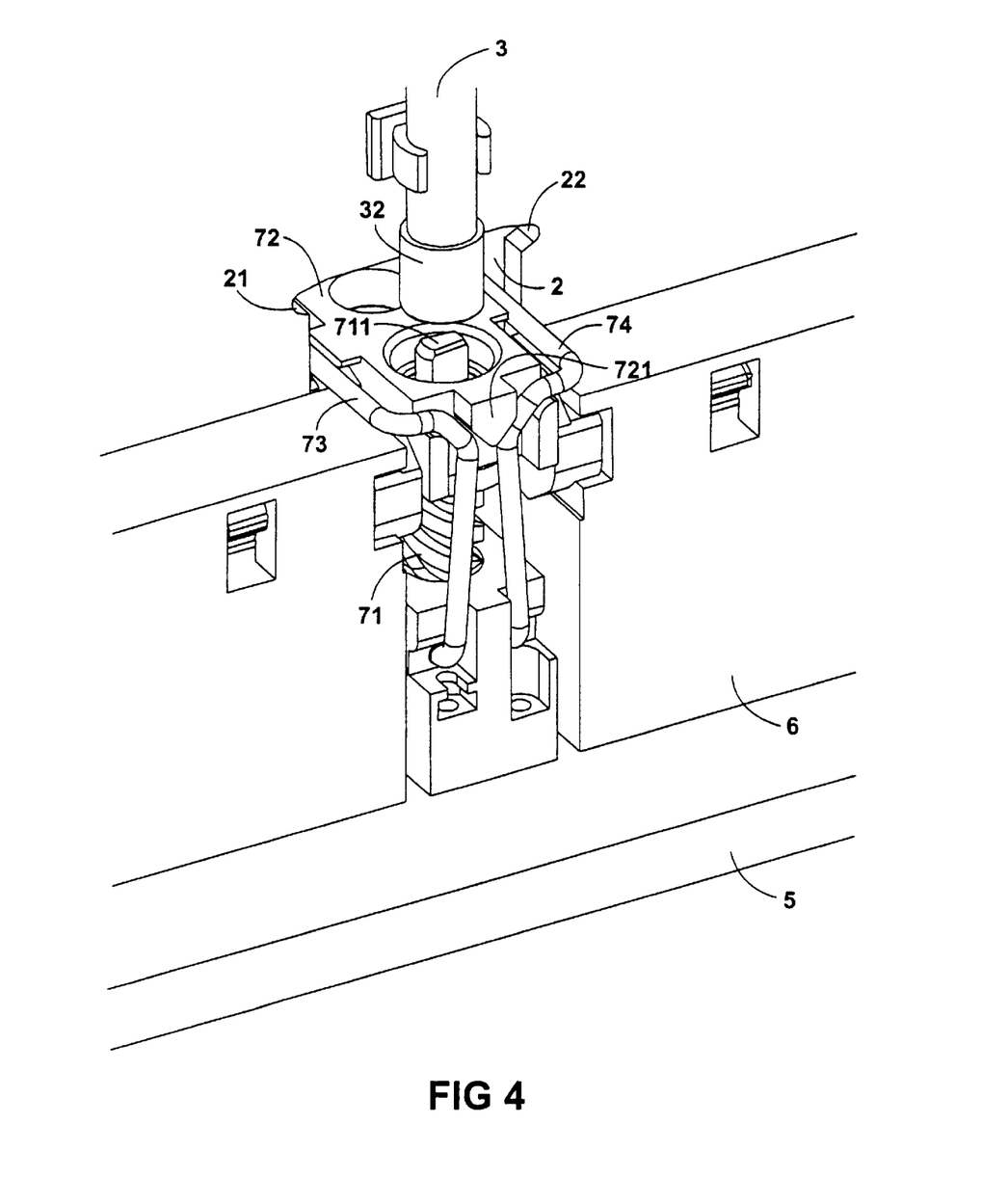
FIGS. 4 to 6 are partial perspective views of various sequential positions of a locking and pivoting mechanism of the printed circuit board zero-force plug connector of FIG. 1 (illustrating the processes during insertion of the printed circuit board shown in FIG. 2 into the printed circuit board zero-force plug connector shown in FIG. 1)
Figure 5:
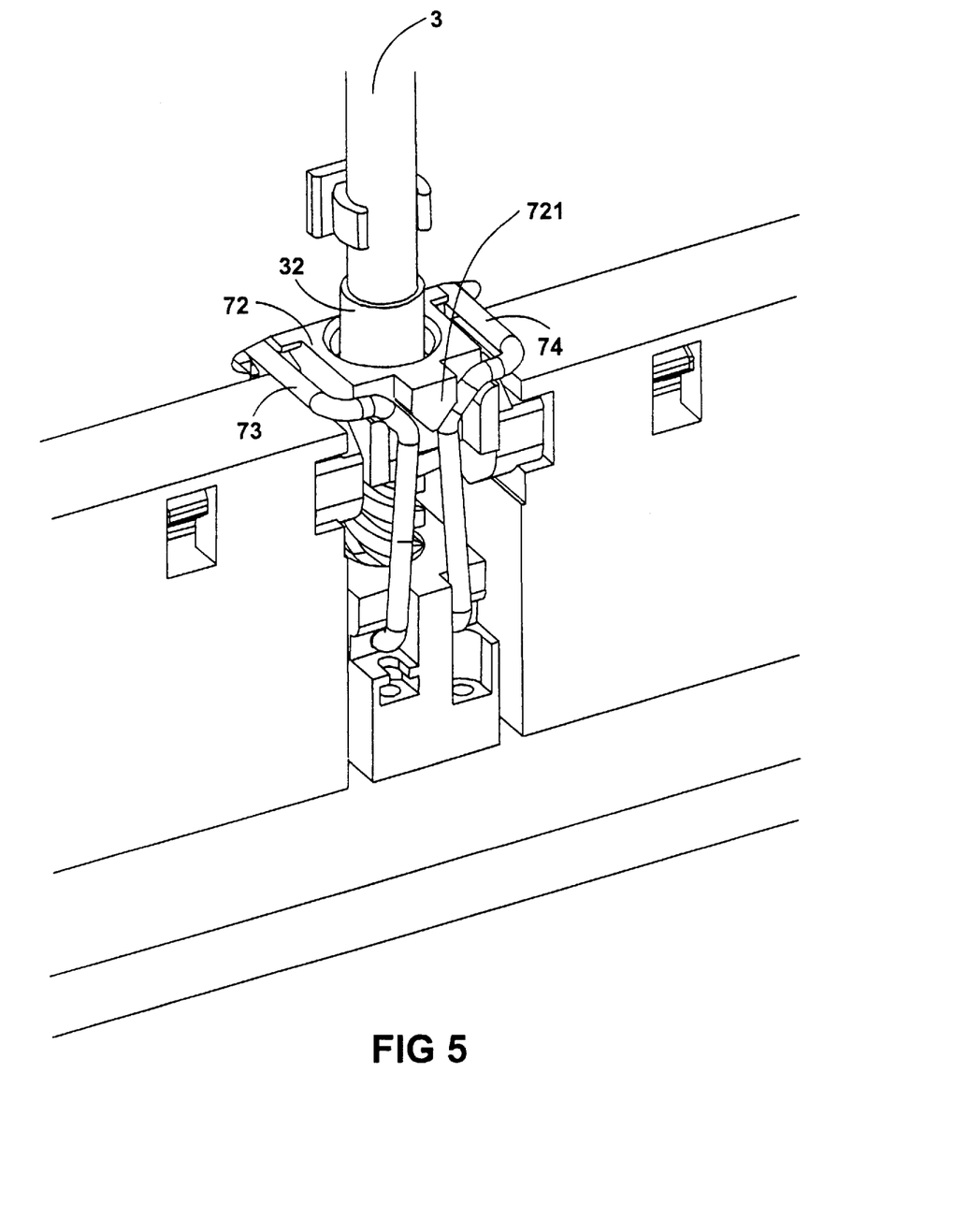
Figure 6:
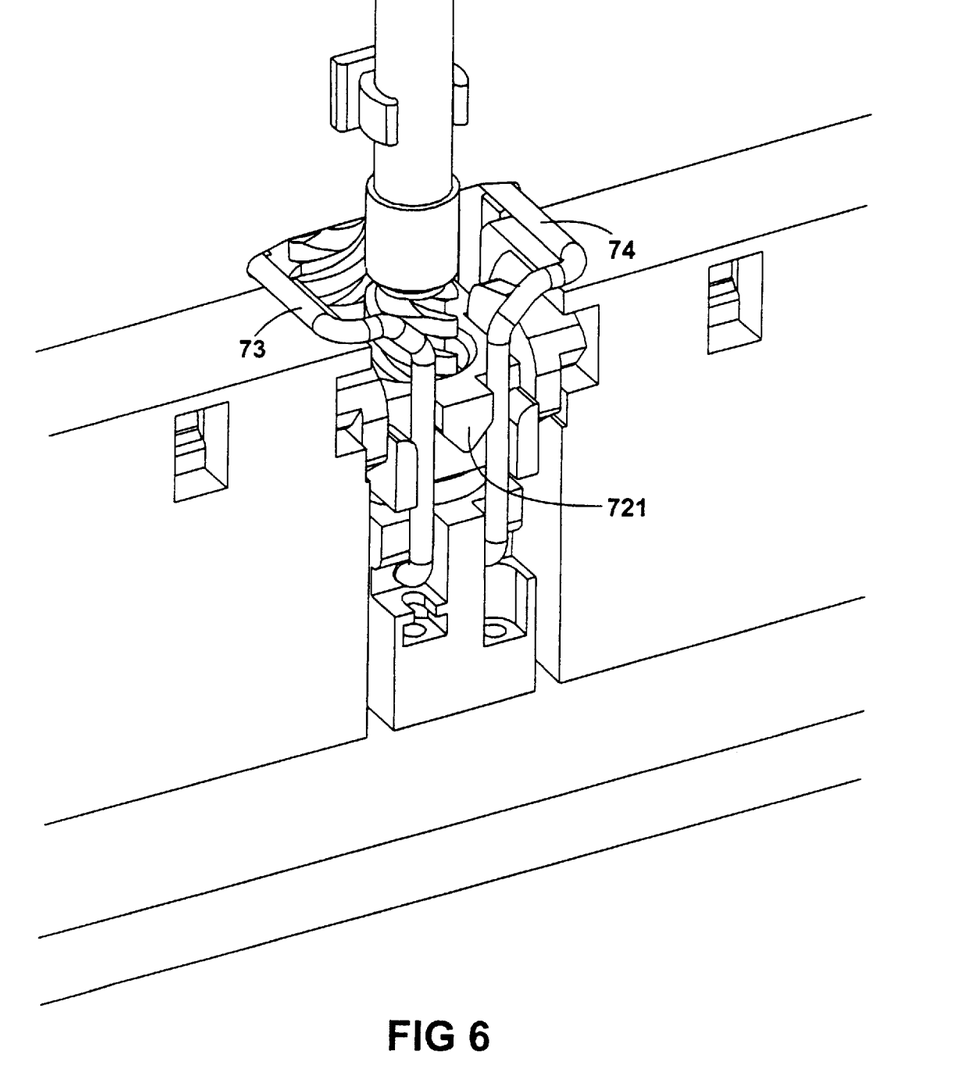

With reference to FIGS. 4 to 6, the mechanism 7 comprises one or more screws, a nut and two printed circuit board locking elements in the form of clips 73, 74.

In the following description, only one screw 71 is provided for the sake of simplicity and clarity.

The screw 71 is mounted such that it can be rotated about its longitudinal axis, but cannot be moved in the axial direction. It is aligned in the insertion direction E and, at its end facing the first printed circuit board 1, has a coupling element 711 which can be engaged with the coupling element 32 of the rod 3 such that they cannot be twisted.

The rod 3 and the screw 71 are designed to be plugged over one another. To be more precise, when the first printed circuit board 1 is being inserted into the printed circuit board zero-force plug connector 6, the rod 3 (at its end which is fitted with the coupling element 32) is pushed onto the screw 71 (at its end which is fitted with the coupling element 711). In the process, the coupling elements 32 and 711 are engaged and the screw 71 follows any rotary movements of the rod 3, i.e., the head 711 and the screw 71 are slaved along by the rod 3.

The nut 72 is fitted on the screw 71. The nut 72 is mounted such that it can be moved along the longitudinal axis of the screw 71, but cannot be rotated about the screw 71.

Rotation of the screw 71 caused by the rod 3 or in some other way thus results in the nut 72 moving up or down along the screw 71.

The clips 73, 74 are arranged on mutually opposite sides of the screw 71, and symmetrically with respect to it. In the exemplary embodiment, the clips are brackets which can be bent elastically, are attached to a fixed-position component of the mechanism 7 at one or more points and can be moved toward one another and away from one another in the other regions.

In the (fitting) state of the mechanism 7 shown in FIG. 4, the clips 73, 74 are pivoted as far as possible toward one another. They can be pushed elastically away from one another (outward) from this position (see FIG. 6). Whether and to what extent, if required, the clips 73, 74 are pushed apart from one another elastically depends on the position of the nut 72; the nut 72 has a side projection 721, which pushes the clips 73, 74 apart from one another depending on the relative position of the nut 72 and clips 73, 74.

When and for as long as the nut 72 is located right at the top, the clips 73, 74 are moved to the maximum extent toward one another (see FIG. 4). Rotation of the screw 71 results in the nut 72 moving downward. The farther the nut 72 moves downward, the more it pushes the clips 73, 74 apart from one another (by means of its side projection 721) (see FIG. 6).

The process of pushing the clips 73, 74 apart from one another results in them being moved (provided the first printed circuit board 1 is inserted correctly) into the cut away regions 21, 22. This causes the first printed circuit board 1 to be secured against being pulled out of the printed circuit board zero-force plug connector 6.

For insertion of the first printed circuit board 1 into the printed circuit board zero-force plug connector 6, the mechanism 7 must be in a state in which the clips 73, 74 are as far apart from one another as possible, so that they do not project beyond the cutout 2 in the first printed circuit board 1 at the side. This is the case when the mechanism 7 is in the fitting position shown in FIG. 4. In order to prevent the mechanism 7 from being able to leave this position inadvertently, it can be provided with a latching mechanism, by means of which it is held in this position.

The coupling elements 32 and 711 of the rod 3 and of the screw 71 may be (but need not be) designed such that they can be engaged only when aligned in a predetermined manner. In this case, when the first printed circuit board 1 is being inserted into the printed circuit board zero-force plug connector 6, the rod 3 must also be in a predetermined position.

The position of the rod 3 can be adjusted by means of an operating lever 31 provided on it. This operating lever 31 can be moved backward and forward between a fitting position (which is symbolized by an open padlock in the example under consideration) and a connected position (which is symbolized by a closed padlock in the example under consideration). The operating lever 31 and/or the first printed circuit board 1 are preferably provided with a latching mechanism by means of which the operating lever 31 can be locked both in the fitting position and in the connected position. In the example under consideration, this latching mechanism is formed by a protrusion 4 which is provided in the pivoting region of the operating lever 31 (between its fitting position and its connected position).

FIGS. 4 to 6 show the process of inserting the first printed circuit board 1 into the printed circuit board zero-force plug connector.

FIG. 4 shows the state in which the first printed circuit board 1 is just inserted into the printed circuit board zero-force plug connector 6 but has not yet reached its correct position. The clips 73, 74 are folded together and do not impede the movement of the first printed circuit board; the rod 3 and the screw 71 have not yet reached one another.

As the movement of the first printed circuit board 1 in the insertion direction E continues—provided both the lever 31 (and thus also the rod 3) as well as the screw 71 are in the fitting position—the rod 3 (its coupling element 32) is pushed over the screw 71 (its coupling element 711). The first printed circuit board 1 is pushed in as far as the stop. The state in which the first printed circuit board 1 has been completely pushed (as far as the stop) into the printed circuit board zero-force plug connector is shown in FIG. 5.

If, in the state shown in FIG. 5, the operating lever 31 is moved from the fitting position to the connected position, then this results in the rod 3 and, via it, the screw 71 as well, being rotated. The rotation of the screw 71 results in the nut 72 being moved downward along it. This in turn results in the clips 73 and 74 being pushed outward into the cut away regions 21, 22 in the first printed circuit board 1. In this state, the clips 73, 74 lock the first printed circuit board 1 in the (correct) position that it then assumes.

This state is reached before the operating lever 31 is in the connected position.

As the movement of the operating lever continues, the rotation of the rod 3 and of the screw 71 result in the connector halves of the printed circuit board zero-force connector 6 being folded together; before the locking of the first printed circuit board (as described or in a similar manner) in its correct position, the connector halves are not moved, or in any case are moved only insignificantly (folded together).

The movement of the connector halves of the printed circuit board zero-force plug connector takes place, for example, by means of toothed racks and/or gearwheels, which are driven by means of the screw 71 or the nut 72 which is moved by it.

Once the operating lever 31 has reached its connected position and is latched in this position, the connector halves are completely folded together and make contact with the first printed circuit board 1. This state is shown in FIG. 6.

In order to remove the first printed circuit board 1 from the printed circuit board zero-force plug connector 6, the operating lever 31 must first of all be moved from its connected position to its fitting position. In the process, the connector halves are first of all folded apart form one another and then—once this has been done—the clips 73, 74 are pivoted out of the cut away regions 21, 22.

Once the operating lever 31 has reached its fitting position, the state shown in FIG. 5 has been reached once again and the first printed circuit board 1 can be removed from the printed circuit board zero-force plug connector.

From the above explanation, it can be seen that the printed circuit board zero-force plug connector is protected against incorrect actions of any type:

the first printed circuit board 1 can be inserted into the printed circuit board zero-force plug connector 6 only when the latter is in the fitting position. If this is not the case, the clips 73, 74 which are otherwise folded apart from one another would be in the way.

the printed circuit board zero-force plug connector can be changed to the connected position only when the first printed circuit board 1 is correctly inserted (as shown in FIG. 5). If the first printed circuit board 1 were incompletely or incorrectly inserted, the clips 73, 74 could not be folded apart from one another; the mechanism 7 would be blocked and it would not be possible for it to start to fold the connector halves together.

Before the connector halves of the printed circuit board zero-force plug connector 6 are folded together, the first printed circuit board 1 is secured against being pulled out by the clips 73, 74 being folded out.

The security against the first printed circuit board 1 being pulled out is maintained until the connector halves are completely folded away from one another. The first printed circuit board 1 can in consequence be removed from the printed circuit board zero-force plug connector only when this connector is in the fitting position.

The described printed circuit board zero-force plug connector is, furthermore, also relatively insensitive to an incorrect arrangement of the rod 3 on the first printed circuit board 1 and/or to the rod 3 being of an incorrect length. As a result of the fact that the coupling of the rod 3 and the mechanism 7 takes place with the rod 3 being pushed onto the screw 71, certain discrepancies from the ideal length and/or the ideal position of the rod 3 can be coped with without any problems; the rod 3 and the screw 71 then overlap only to a somewhat greater or lesser extent than is the case in the ideal situation.

The description of the mechanism so far has been based on the assumption that this mechanism comprises only one screw. As has already been mentioned in the introduction, and as can be seen from the figures, the mechanism 7 in reality comprises two screws and a common nut, which is connected to both screws. Of the two screws, one screw (the screw 71) is driven by the rod 3, and the second screw is driven, for example, via a gearwheel by the first screw 71. The screws rotate in synchronism and move the nut 72 and the clips 73, 74 together. The provision of two screws is advantageous since, in consequence, the clips 73, 74 and the connector halves can be moved uniformly, in synchronism and symmetrically with little effort. Nevertheless, it is, however, also possible to provide a (locking and pivoting) mechanism with only one screw.

Figure 7:
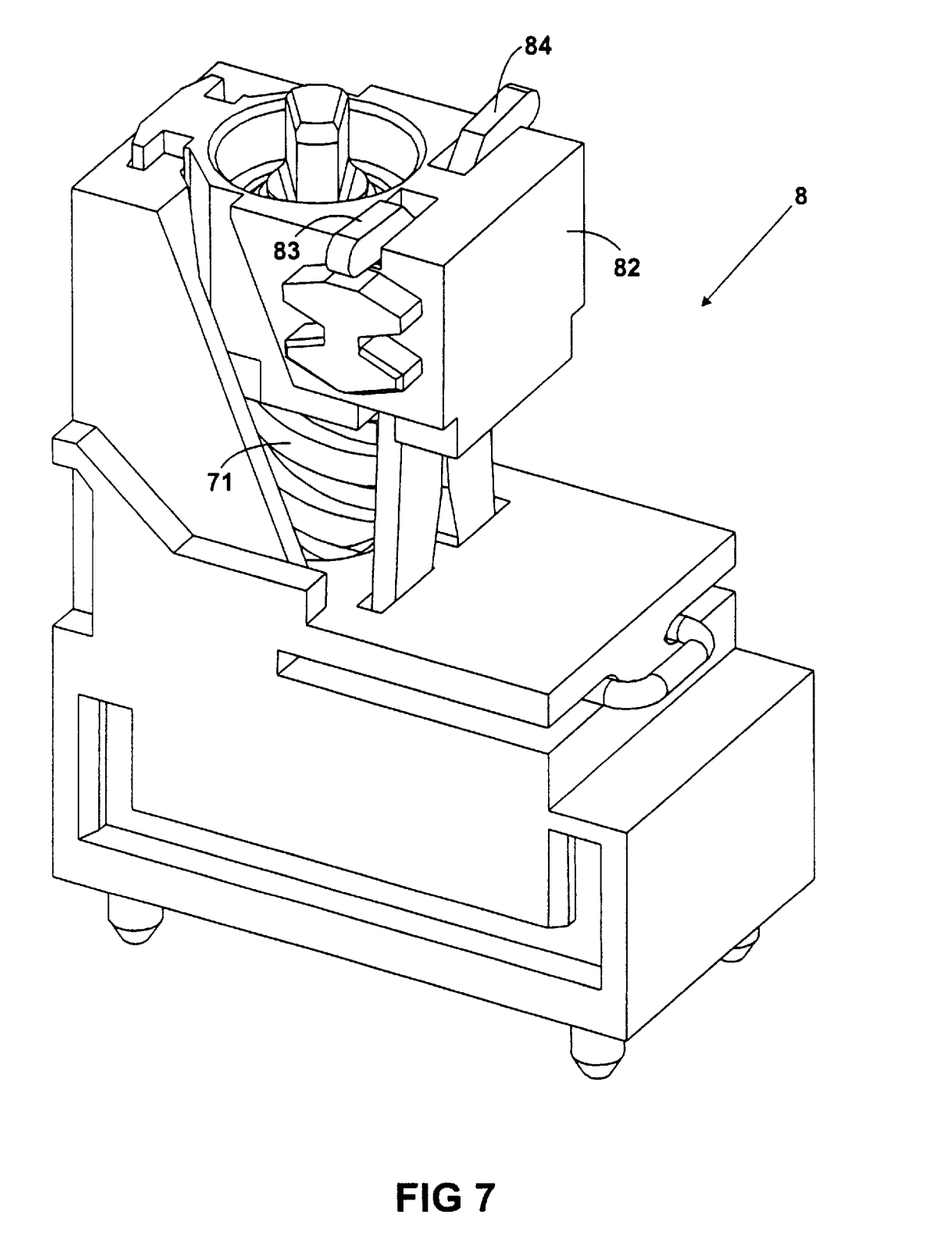
FIGS. 7 and 8 are perspective views of two states of a modified locking and pivoting mechanism.
Figure 8:
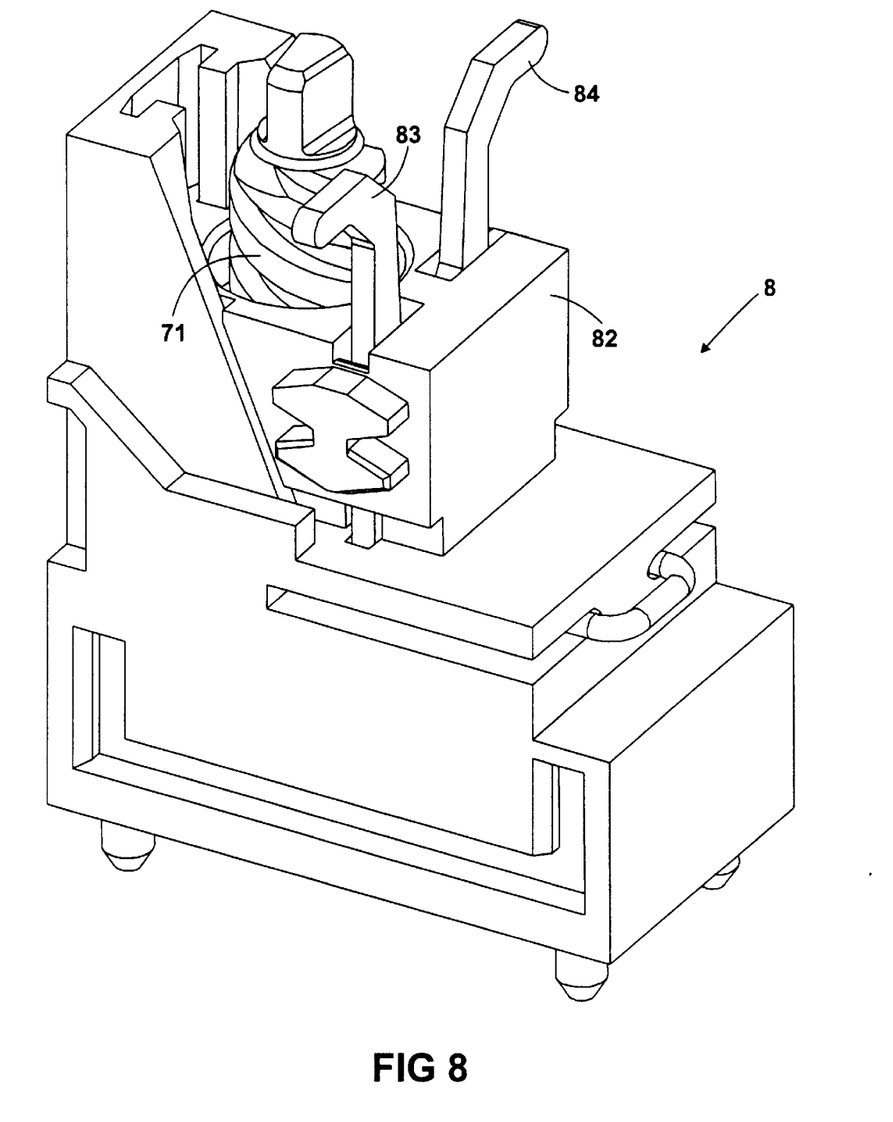

The mechanism 8 which is described in the following text with references to FIGS. 7 and 8 is a mechanism of this type.

The mechanism 8 shown in FIGS. 7 and 8 also differs from the mechanism 7 shown in FIGS. 1 to 6 in a number of other ways.

In particular:
the mechanism 8 has different types of printed circuit board locking elements (hooks 83, 84 which are mounted such that they can be rotated or can be bent elastically are used instead of the clips 73, 74); and
a modified nut 82 is provided (which is additionally guided in guide rails and has a different type of locking element movement mechanism, specifically one which is cam-controlled).

Otherwise, it corresponds to the mechanism 7 shown in FIGS. 1 to 6. In particular, there exists no difference in the operation, function and method of operation; the state of the mechanism 8 shown in FIG. 7 corresponds to the state of the mechanism 7 shown in FIGS. 4 and 5, and the state of the mechanism 8 shown in FIG. 8 corresponds to the state of the mechanism 7 shown in FIG. 6.

This is to make it clear that the mechanisms 7 and 8 can be modified additionally or differently in many different ways.

For example, it can be provided for the number of printed circuit board locking elements, that is to say the number of clips 73, 74, hooks 83, 84 or other printed circuit board locking elements to be modified; any desired number of printed circuit board locking elements may be provided, that is to say fewer than or more than two.

Printed circuit board locking elements other than clips and hooks may also be used as printed circuit board locking elements. In this case, the printed circuit board locking elements may be capable of being rotated (pivoted) about an axis like the hooks 83, 84 for example, and/or may be capable of being bent elastically, like the clips 73, 74 for example, irrespective of their nature. Particularly in the situation where the printed circuit board locking elements can be rotated about an axis, it is possible to provide for them to be moved to a defined position, or to be held in this position, by means of a return spring, for example.

There is also no limitation to the coupling elements 32, 711 being formed by the rod 3 and the screw 71 as illustrated and described. In particular, it is also possible to provide for the rod 3 to be inserted into the screw 71 (into an appropriate opening in it).

Finally, there is also no limitation to the operating member for operating the mechanism 7, 8 being a rod 3 which is mounted on the first printed circuit board 1. It is also feasible for the mechanism to be operated by a conventional or separate tool (for example a conventional or special screwdriver). In this case, a cutout for the tool to pass through would have to be provided in the front panel of the first printed circuit board, and/or the front panel would have to be entirely omitted. Alternatively or additionally, it is possible to provide for the mechanism 7, 8 to be operated from the rear (from the rear side of the second printed circuit board 5). In this case, the second printed circuit board 5 would have to have appropriate cutouts for the tool to pass through.

Irrespective of the details of the practical implementation, printed circuit board zero-force plug connectors as described or of a similar design reduce to a minimum, in an extremely simple way, the risk of serious damage to the printed circuit board and/or to the printed circuit board zero-force plug connector, and/or the risk of incorrect connection of the printed circuit boards which are to be connected.

I claim:

1. A printed circuit board zero-force plug connector assembly, comprising:
a printed circuit board zero-force plug connector adapted to assume a fitting position allowing selective insertion and removal of a printed circuit board and a connected position making contact with the printed circuit board;
a mechanism operatively connected to said printed circuit board zero-force plug connector for selectively moving the circuit board zero-force plug connector into the fitting position and the connected position; and
an operating member rotatably disposed for operating said mechanism with a rotary movement, said operating member being a rod rotatably supported about a longitudinal axis thereof on the printed circuit board.

2. The printed circuit board zero-force plug connector assembly according to claim 1, wherein said mechanism is operated by a special tool.

3. The printed circuit board zero-force plug connector assembly according to claim 1, wherein said operating member includes a screw rotatably mounted about said longitudinal axis thereof and substantially stationary in a longitudinal direction, and said rod and said screw engage one another to lock against relative rotation when the printed circuit board is inserted correctly into said printed circuit board zero-plug connector.

4. The printed circuit board zero-force plug connector assembly according to claim 1, wherein said mechanism includes a screw rotatably mounted about said longitudinal axis thereof and substantially stationary in a longitudinal direction.

5. The printed circuit board zero-force plug connector assembly according to claim 3, wherein said rod and said screw engage such that a rotation of said rod causes said screw to rotate.

6. The printed circuit board zero-force plug connector assembly according to claim 3, wherein said rod has an end facing said mechanism and said screw has an end facing said rod, said end of said rod and said end of said screw being inserted one into the other when the printed circuit board is correctly inserted into said printed circuit board zero-force plug connector.

7. The printed circuit board zero-force plug connector assembly according to claim 4, wherein said mechanism further includes a nut adapted to be screwed onto said screw.

8. The printed circuit board zero-force plug connector assembly according to claim 7, wherein said nut is non-rotatably mounted and to be moved along said screw.

9. The printed circuit board zero-force plug connector assembly according to claim 1, wherein said mechanism comprises locking elements for locking the printed circuit board in a correctly inserted position thereof.

10. The printed circuit board zero-force plug connector assembly according to claim 9, wherein said locking elements are movably disposed or elastically bendable and wherein a position thereof is defined by a position of a nut of said locking mechanism.

11. The printed circuit board zero-force plug connector assembly according to claim 9, wherein said locking elements are disposed to be moveable only when and for as long as the printed circuit board has not yet made or is no longer making contact with said printed circuit board zero-force plug connector.

12. A printed circuit board zero-force plug connector assembly, comprising:

a printed circuit board zero-force plug connector adapted to assume a fitting position allowing selective insertion and removal of a printed circuit board and a connected position making contact with the printed circuit board;

a mechanism operatively connected to said printed circuit board zero-force plug connector for selectively moving the circuit board zero-force plug connector into the fitting position and the connected position;

said mechanism being adapted to start to move the printed circuit board zero-force plug connector into the connected position only after having locked the printed circuit board in a correctly aligned position, and to release the locking of the printed circuit board only after having moved the printed circuit board zero-force plug connector to the fitting position; and an operating member including a rod rotatable supported about a longitudinal axis thereof on the printed circuit board.

13. The printed circuit board zero-force plug connector assembly according to claim 12, wherein said mechanism is operated by a special tool.

14. The printed circuit board zero-force plug connector assembly according to claim 12, wherein said operating member includes a screw rotatably mounted about said longitudinal axis thereof and substantially stationary in a longitudinal direction, and said rod and said screw engage one another to lock against relative rotation when the printed circuit board is inserted correctly into said printed circuit board zero-plug connector.

15. The printed circuit board zero-force plug connector assembly according to claim 14, wherein said rod has an end facing said mechanism and said screw has an end facing said rod, said end of said rod and said end of said screw being inserted one into the other when the printed circuit board is correctly inserted into said printed circuit board zero-force plug connector.

16. The printed circuit board zero-force plug connector assembly according to claim 14, wherein said rod and said screw engage such that a rotation of said rod causes said screw to rotate.

17. The printed circuit board zero-force plug connector assembly according to claim 12, wherein said mechanism includes a screw rotatably mounted about said longitudinal axis thereof and substantially stationary in a longitudinal direction.

18. The printed circuit board zero-force plug connector assembly according to claim 17, wherein said mechanism further includes a nut adapted to be screwed onto said screw.

19. The printed circuit board zero-force plug connector assembly according to claim 18, wherein said nut is non-rotatably mounted and to be moved along said screw.

20. The printed circuit board zero-force plug connector assembly according to claim 13, wherein said mechanism comprises locking elements for locking the printed circuit board in a correctly inserted position thereof.

21. The printed circuit board zero-force plug connector assembly according to claim 20, wherein said locking elements are movably disposed or elastically bendable and wherein a position thereof is defined by a position of a nut of said locking mechanism.

22. The printed circuit board zero-force plug connector assembly according to claim 20, wherein said locking elements are disposed to be moveable only when and for as long as the printed circuit board has not yet made or is no longer making contact with said printed circuit board zero-force plug connector.

\* \* \* \* \*